(12) United States Patent
Lee et al.

(10) Patent No.: US 9,112,054 B2
(45) Date of Patent: Aug. 18, 2015

(54) METHODS OF MANUFACTURING SEMICONDUCTOR DEVICES

(75) Inventors: Kwan-Heum Lee, Suwon-si (KR); Wook-Je Kim, Gwacheon-si (KR); Soon-Wook Jung, Hwaseong-si (KR); Sang-Bom Kang, Seoul (KR); Ki-Hong Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 13/181,907

(22) Filed: Jul. 13, 2011

(65) Prior Publication Data

US 2012/0015489 A1    Jan. 19, 2012

(30) Foreign Application Priority Data

Jul. 14, 2010   (KR) .................. 10-2010-0067763

(51) Int. Cl.
  *H01L 21/336*  (2006.01)
  *H01L 21/8238*  (2006.01)
  *H01L 29/78*   (2006.01)

(52) U.S. Cl.
  CPC *H01L 21/823807* (2013.01); *H01L 21/823814* (2013.01); *H01L 29/7848* (2013.01)

(58) Field of Classification Search
  CPC .................................................. H01L 29/66628
  See application file for complete search history.

(56) References Cited

U.S. PATENT DOCUMENTS

| | | | |
|---|---|---|---|
| 6,617,654 B2* | 9/2003 | Oishi et al. ..................... 257/382 |
| 7,566,605 B2 | 7/2009 | Shifren et al. |
| 7,586,153 B2 | 9/2009 | Hoentschel et al. |
| 7,602,031 B2* | 10/2009 | Kim .............................. 257/413 |
| 2007/0252149 A1* | 11/2007 | Yamazaki et al. ............... 257/59 |
| 2008/0096336 A1* | 4/2008 | Lim et al. ...................... 438/187 |
| 2008/0153237 A1* | 6/2008 | Rachmady et al. ........... 438/300 |

* cited by examiner

*Primary Examiner* — Zandra Smith
*Assistant Examiner* — Andre' C Stevenson
(74) *Attorney, Agent, or Firm* — Sughrue Mion, PLLC (57) ABSTRACT

A semiconductor device and a method of manufacturing a semiconductor device are provided. In a method of manufacturing a semiconductor device, a gate structure is formed on a substrate. An epitaxial layer is formed on a top surface of the substrate adjacent to the gate structure. An elevated source/drain (ESD) layer and an impurity region are formed by implanting impurities and carbon in the epitaxial layer and an upper portion of the substrate using the gate structure as an ion implantation mask. A metal silicide layer is formed on the ESD layer.

20 Claims, 8 Drawing Sheets

METHODS OF MANUFACTURING SEMICONDUCTOR DEVICES

CROSS-REFERENCE TO RELATED APPLICATIONS

This application claims priority from Korean Patent Application No. 2010-0067763, filed on Jul. 14, 2010 in the Korean Intellectual Property Office, the contents of which are herein incorporated by reference in their entirety.

BACKGROUND

1. Field

Apparatuses and methods consistent with the exemplary embodiments relate to semiconductor devices and methods of manufacturing the same. More particularly, exemplary embodiments relate to semiconductor devices including an elevated source/drain (ESD) layer and methods of manufacturing the semiconductor devices.

2. Description of the Related Art

In order to improve the operation current characteristics and the operation speed of a transistor, a theory of increasing the mobility of electrons or holes of the transistor by applying a tensile stress or a compress stress to a channel region of the transistor has been introduced. For example, carbon may be implanted in source/drain regions of an NMOS transistor so that a tensile stress may be applied on a side portion of the channel region.

However, when an ohmic layer including a metal silicide is formed on the source/drain region in a subsequent process, carbon in the source/drain regions may be consumed, and thus a tensile stress may not be sufficiently applied to the channel region of the transistor.

SUMMARY

One or more exemplary embodiments provide a semiconductor device having improved operation speed.

One or more exemplary embodiments provide a method of manufacturing a semiconductor device having improved operation speed.

According to an aspect of an exemplary embodiment, there is provided a method of manufacturing a semiconductor device. In the method, a gate structure is formed on a substrate. An epitaxial layer including silicon is formed on a top surface of the substrate adjacent to the gate structure. An elevated source/drain (ESD) layer and an impurity region are formed by implanting impurities and carbon in the epitaxial layer and an upper portion of the substrate using the gate structure as an ion implantation mask. A metal silicide layer is formed on the ESD layer.

In forming the epitaxial layer, a selective epitaxial growth (SEG) process may be performed using the top surface of the substrate adjacent to the gate structure as a seed layer.

The impurities may include n-type impurities.

In forming the metal silicide, a metal layer may be deposited on the ESD layer. A heat treatment process may be performed on the metal layer together with the ESD layer.

The metal layer may include titanium, nickel, cobalt or platinum.

The carbon of the ESD layer may be consumed when the metal silicide layer is formed.

According to another aspect of an exemplary embodiment, there is provided a method of manufacturing a semiconductor device. In the method, first and second gate structures are formed on a substrate in first and second regions, respectively. The substrate is divided into the first and second regions. A first epitaxial layer including silicon is formed on a first top surface of the substrate in the first region adjacent to the first gate structure. A first ESD layer and a first impurity region are formed by implanting first impurities and carbon in the first epitaxial layer and a first upper portion of the substrate in the first region using the first gate structure as an ion implantation mask. A silicon-germanium (SiGe) layer is formed on the substrate in the second region adjacent to the second gate structure. A first metal silicide layer is formed on the first ESD layer.

After forming the SiGe layer, a second epitaxial layer including silicon may be formed on the SiGe layer and a second top surface of the substrate. A second ESD layer and a second impurity region may be formed by implanting second impurities in the second epitaxial layer and a second upper portion of the substrate in the second region using the second gate structure as an ion implantation mask. A second metal silicide layer may be formed on the second ESD layer.

The forming of the second metal silicide layer may be performed simultaneously with forming the first metal silicide layer.

The first impurities may be n-type impurities and the second impurities may be p-type impurities.

In forming the SiGe layer, a trench may be formed by removing an upper portion of the substrate in the second region adjacent to the second gate structure. The SiGe layer may be formed by performing a SEG process to fill the trench.

A wiring that is electrically connected to the first metal silicide layer may be further formed.

According to another aspect of an exemplary embodiment, there is provided a semiconductor device. The semiconductor device includes a gate structure, an impurity region, an ESD layer and a silicide layer. The gate structure is formed on a substrate. The impurity region is formed at an upper portion of the substrate adjacent to the gate structure, and the impurity region includes n-type impurities and carbon of a first concentration. The ESD layer is formed on the impurity region and the ESD layer includes n-type impurities and carbon of a second concentration lower than the first concentration. The metal silicide layer is formed on the ESD layer.

According to another aspect of an exemplary embodiment, there is provided a semiconductor device. The semiconductor device includes first and second gate structures, first and second impurity regions, first and second ESD layers and first and second metal silicide layers. The first and second gate structures are formed on a substrate in first and second regions, respectively. The first impurity region is formed at a first upper portion of the substrate in the first region adjacent to the first gate structure, and the first impurity region includes n-type impurities and carbon of a first concentration. The second impurity region is formed at a second upper portion of the substrate in the second region adjacent to the second gate structure, and the second impurity region includes p-type impurities. The first ESD layer is formed on the first impurity region, and the first ESD layer includes n-type impurities and carbon of a second concentration lower than the first concentration. The second ESD layer is formed on the second impurity region, and the second ESD layer includes p-type impurities. The first metal silicide layer is formed on the first ESD layer. The second metal silicide layer is formed on the second ESD layer.

A SiGe layer may be further formed between the second impurity region and the second ESD layer.

Wirings that are electrically connected to the first and second metal silicide layers may be further formed.

According to one or more example embodiments, the ESD layer may be formed between the metal silicide layer and the impurity region. Thus, silicon and carbon in the ESD layer may be consumed when the metal silicide layer is formed, while the impurity region may maintain the initial carbon concentration thereof. Accordingly, the tensile stress applied to the channel region may not be reduced, so that the electron mobility of the transistor may not be reduced. Thus, the semiconductor device may have improved operation speed and high operation current characteristics.

BRIEF DESCRIPTION OF THE DRAWINGS

Example embodiments will be more clearly understood from the following detailed description taken in conjunction with the accompanying drawings. FIGS. 1 to 16 represent non-limiting, example embodiments as described herein.

DESCRIPTION OF EXEMPLARY EMBODIMENTS

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 4 are cross-sectional views illustrating a method of manufacturing a semiconductor device in accordance with an exemplary embodiment.

Figure 1:
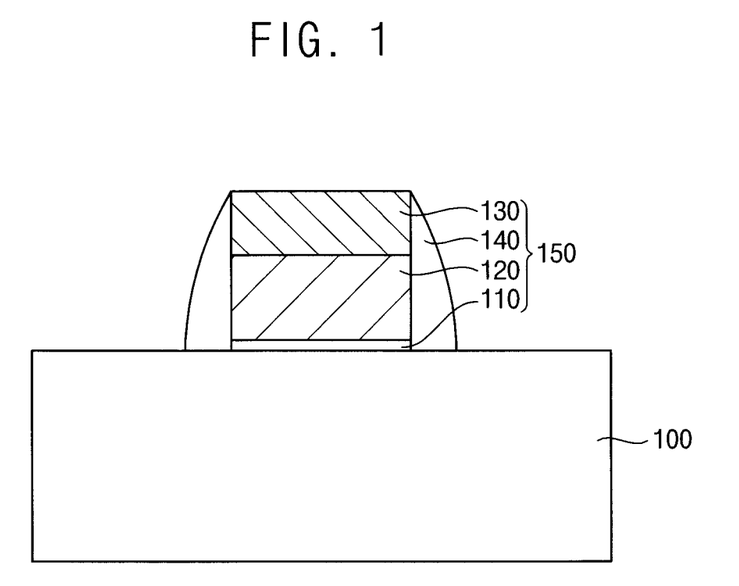
FIGS. 1 to 4 are cross-sectional views illustrating a method of manufacturing a semiconductor device in accordance with an exemplary embodiment.

Referring to FIG. 1, a gate structure 150 may be formed on a substrate 100.

The substrate 100 may include a semiconductor substrate such as a silicon substrate, a germanium substrate, a silicon-germanium substrate, a silicon-on-insulator (SOI) substrate, or a germanium-on-insulator (GOI) substrate. The substrate 100 may further include a well region (not shown) including p-type impurities or n-type impurities.

The gate structure 150 may be formed by sequentially stacking a gate insulation layer, a gate conductive layer and a gate mask layer on a substrate 100, and by patterning the gate mask layer, the gate conductive layer and the gate insulation layer using a photolithography process. Thus, the gate structure 150 may be formed to include a gate insulation layer pattern 110, a gate electrode 120 and a gate mask 130 sequentially stacked on the substrate 100.

The gate insulation layer may be formed using an oxide such as silicon oxide or an oxynitride such as silicon oxynitride. The gate insulation layer may be formed by performing a thermal oxidation process or a chemical vapor deposition (CVD) process on the substrate 100. The gate conductive layer may be formed using doped polysilicon, a metal, a metal nitride and/or a metal silicide. The gate mask layer may be formed using silicon nitride or silicon oxynitride. The gate conductive layer and the gate mask layer may be formed by a CVD process, a physical vapor deposition (PVD) process or an atomic layer deposition (ALD) process.

The gate structure 150 may further include a gate spacer 140 on sidewalls of the gate mask 130, the gate electrode 120 and the gate insulation layer pattern 110. Specifically, a spacer layer may be formed on the substrate 100 to cover the gate mask 130, the gate electrode 120 and the gate insulation layer pattern 110, and the spacer layer may be partially removed by an anisotropic etching process to form the gate spacer 140. The spacer layer may be formed using a nitride such as silicon nitride.

Figure 2:
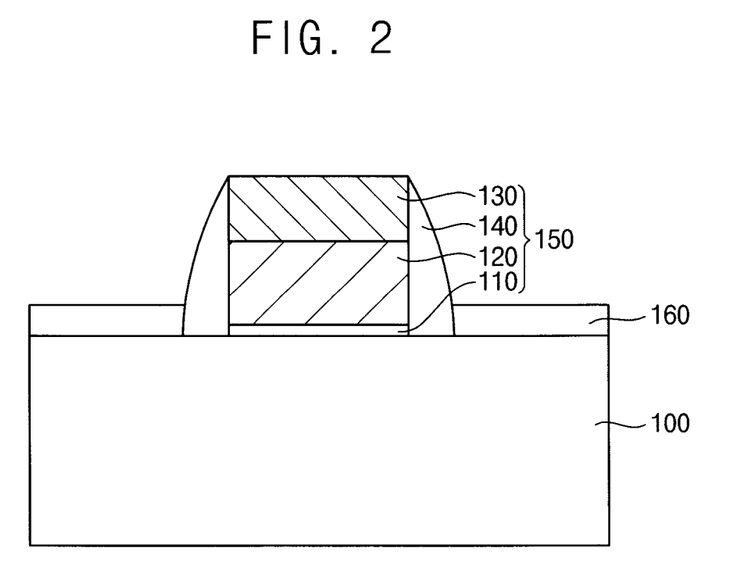

Referring to FIG. 2, an epitaxial layer 160 may be formed by performing an SEG process on the substrate 100. The epitaxial layer 160 may be formed using a top surface of the substrate 100 that is not covered by the gate structure 150 as a seed layer.

In an exemplary embodiment, the SEG process may be performed by a CVD process at a temperature of about 700° C. to about 900° C. under a pressure of about 10 torr to 50 torr. For example, the CVD process may be performed using a dichlorosilane ($SiH_2Cl_2$) gas to form a single crystalline silicon layer. Alternatively, the SEG process may be performed by a reduced pressure CVD (RPCVD) process, a low pressure CVD (LPCVD) process, an ultra high vacuum CVD (UHV-CVD) process or a metal organic CVD (MOCVD) process. In an exemplary embodiment, the epitaxial layer 160 may be formed to have a thickness of about 100 Å to about 500 Å, however the thickness of the epitaxial layer 160 is not limited thereto.

Figure 3:
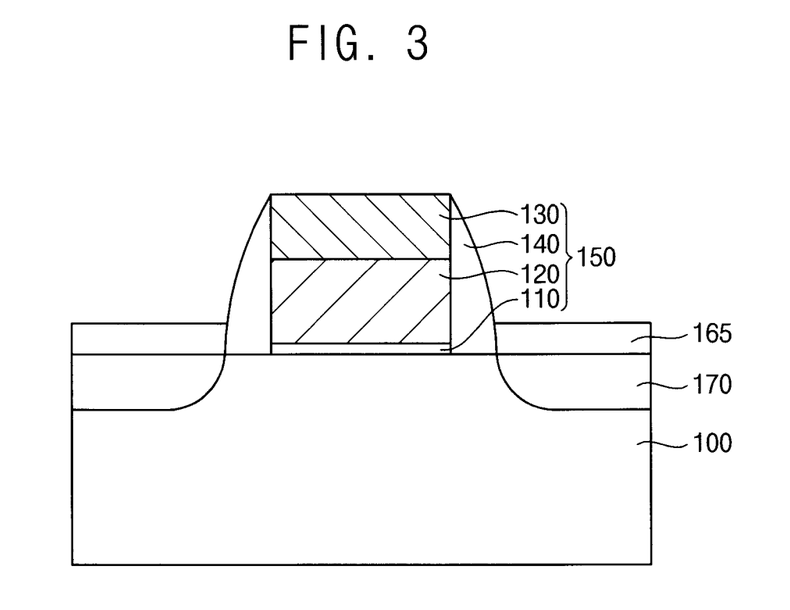

Referring to FIG. 3, impurities may be implanted in the epitaxial layer 160 and an upper portion of the substrate 100 by an ion implantation process using the gate structure 150 as an ion implantation mask. Thus, an impurity region 170 may be formed at the upper portion of the substrate 100 adjacent to the gate structure 150, and the epitaxial layer 160 may serve as an elevated source/drain (ESD) layer. That is, the epitaxial layer 160 together with the impurity region 170 may serve as a source/drain region of a transistor. Hereinafter, an epitaxial layer 160 doped with impurities may be defined as an ESD layer 165. According to an exemplary embodiment, the impurities may include n-type impurities such as phosphorous or arsenic. The impurity region 170 may be formed to have a thickness of about 100 Å to about 1000 Å, however the thickness of the impurity region 170 is not limited thereto.

During the ion implantation process, carbon ions may be implanted into the epitaxial layer 160 and the upper portion of the substrate 100 adjacent to the gate structure 150. In an exemplary embodiment, carbon ions may be implanted at a dose of about 5E19 to about 5E21 ions/$cm^3$. The impurity region 170 and the ESD layer 165 may include a silicon carbide (SiC). The impurity region 170 may include carbon therein so that a tensile stress may be applied to side portions of a channel region between the impurity regions 170, thereby enhancing the electron mobility of the channel region.

Alternatively, carbon ions may be implanted before or after the ion implantation process.

According to an exemplary embodiment, an additional heat treatment process may be performed after the ion implantation process.

Figure 4:
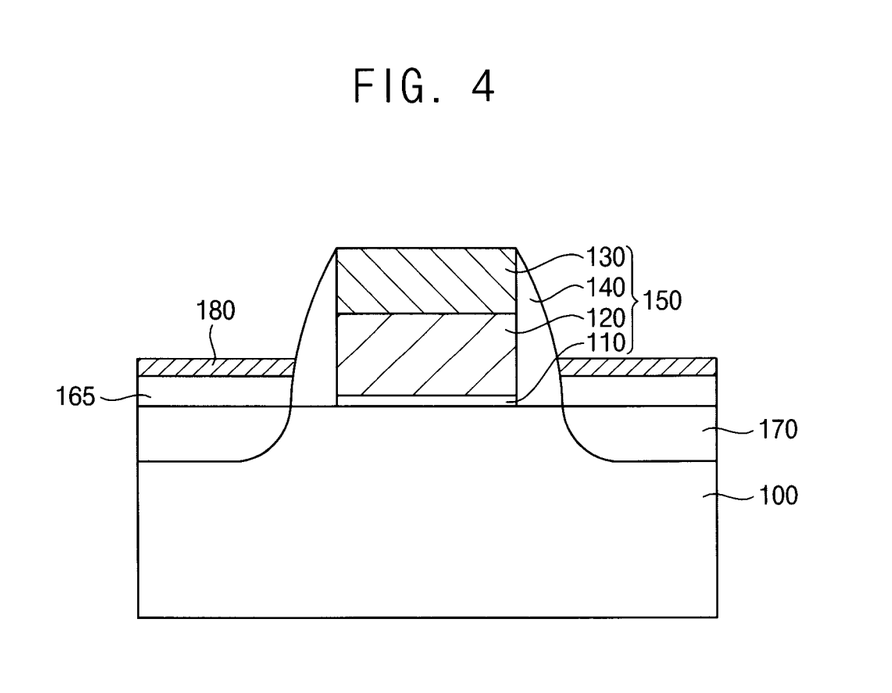

Referring to FIG. 4, an ohmic layer 180 may be formed on the ESD layer 165. According to an exemplary embodiment, a metal layer may be formed on the ESD layer 165, and a heat treatment process may be performed on the metal layer together with the ESD layer 165 to form the ohmic layer 180, which may include a metal silicide. The metal layer may include titanium, nickel, cobalt or platinum. In an exemplary embodiment, the ohmic layer 180 may be formed to have a thickness of about 100 Å to 500 Å, however the thickness of the ohmic layer 180 is not limited thereto.

According to an exemplary embodiment, the ESD layer 165 may be formed between the ohmic layer 180 and the impurity region 170. Thus, silicon and carbon in the ESD layer 165 may be consumed when the ohmic layer 180 is formed, while the impurity region 170 may maintain the initial carbon concentration thereof. Accordingly, the tensile stress applied to the channel region may not be reduced, so that the electron mobility of the transistor may not be reduced. Thus, the semiconductor device may have improved operation speed and high operation current characteristics.

FIGS. 5 to 13 are cross-sectional views illustrating a method of manufacturing a semiconductor device in accordance with an exemplary embodiment.

Figure 5:
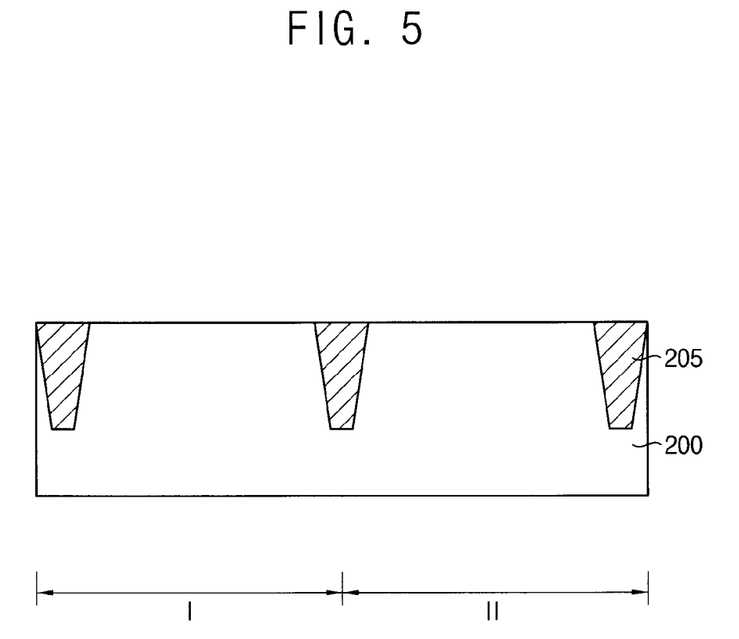
FIGS. 5 to 13 are cross-sectional views illustrating a method of manufacturing a semiconductor device in accordance with an exemplary embodiment.

Referring to FIG. 5, a trench (not shown) may be formed on a substrate 200, which may be divided into a first region I and a second region II, by removing an upper portion of the substrate 200, and an isolation layer pattern 205 may be formed to fill the trench. In an exemplary embodiment, the first and second regions I and II may be a negative-channel metal oxide semiconductor (NMOS) region and a positive-channel metal oxide semiconductor (PMOS) region, respectively.

Figure 6:
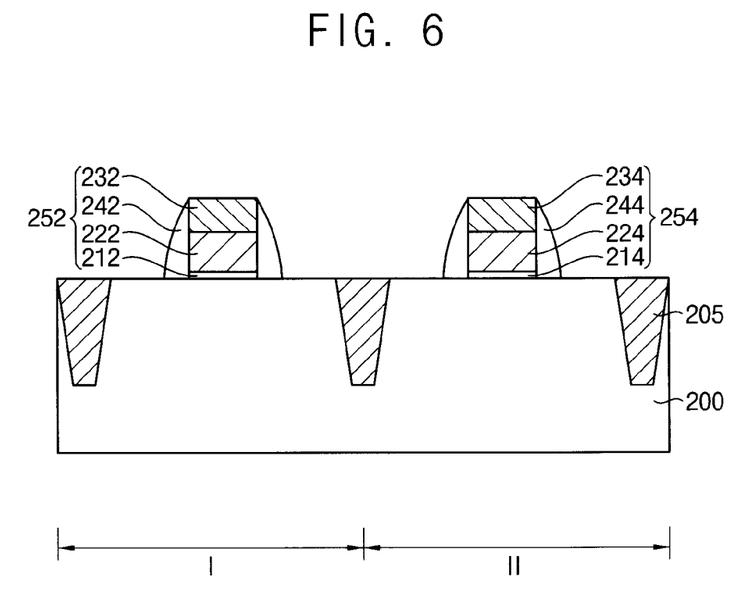

Referring to FIG. 6, a gate insulation layer, a gate conductive layer and a gate mask layer may be sequentially formed on the substrate and patterned by a photolithography process, thereby to form a first gate insulation layer pattern 212, a first gate electrode 222 and a first gate mask 232 sequentially stacked on the substrate 200 in the first region I and to form a second gate insulation layer pattern 214, a second gate electrode 224 and a second gate mask 234 sequentially stacked on the substrate 200 in the second region II. A spacer layer may be formed on the substrate 200 to cover the gate masks 232 and 234, the gate electrodes 222 and 224 and the gate insulation layer patterns 212 and 214. The spacer layer may be partially removed by an anisotropic etching process to form a first spacer 242 and a second spacer 244 in the first region I and the second region II, respectively. The spacer layer may be formed using a nitride such as silicon nitride.

Thus, a first gate structure 252 may be formed to include the first gate insulation layer pattern 212, the first gate electrode 222 and the first gate mask 232 sequentially stacked on the substrate 200 in the first region I and the first gate spacer 242 on sidewalls thereof. A second gate structure 254 may be formed to include the second gate insulation layer pattern 214, the second gate electrode 224 and the second gate mask 234 sequentially stacked on the substrate 200 in the second region II and the second spacer 244 on sidewalls thereof.

A re-oxidation process may be performed on the gate structures 252 and 254 and the substrate 200 to cure etching damages thereto generated in the patterning process.

Figure 7:
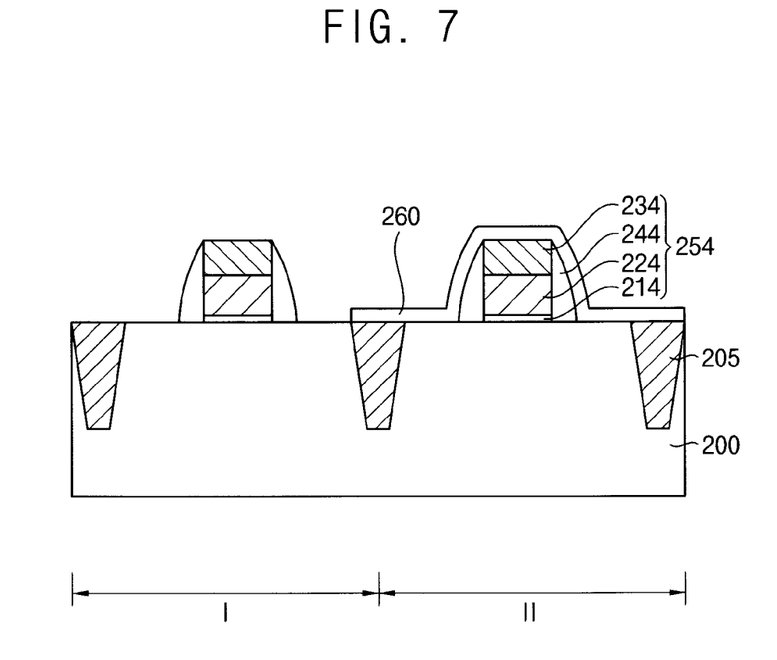

Referring to FIG. 7, a growth stop layer 260 may be formed on the second gate structure 254 and the substrate 200 in the second region II. In an example embodiment, the growth stop layer 260 may be formed to have a thickness of about 500 Å to about 1000 Å using a nitride, however the thickness of the growth stop layer 260 is not limited thereto.

Figure 8:
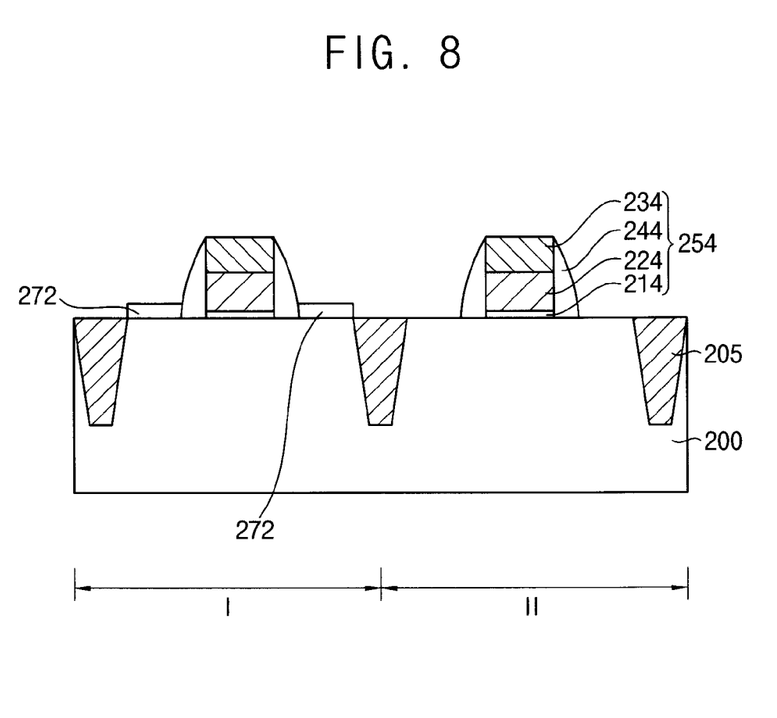

Referring to FIG. 8, a first SEG process may be performed on the substrate 200 in the first region I to form a first epitaxial layer 272. The first epitaxial layer 272 may be formed using a first top surface of the substrate 200 in the first region I that is not covered by the first gate structure 252 as a seed layer. For example, the first SEG process may be performed by a CVD process using a dichlorosilane ($SiH_2Cl_2$) gas to form a single crystalline silicon layer. In an exemplary embodiment, the first epitaxial layer 272 may be formed to have a thickness of about 100 Å to about 500 Å, however the thickness of the first epitaxial layer 272 is not limited thereto. The growth stop layer 260 may also be removed.

Figure 9:
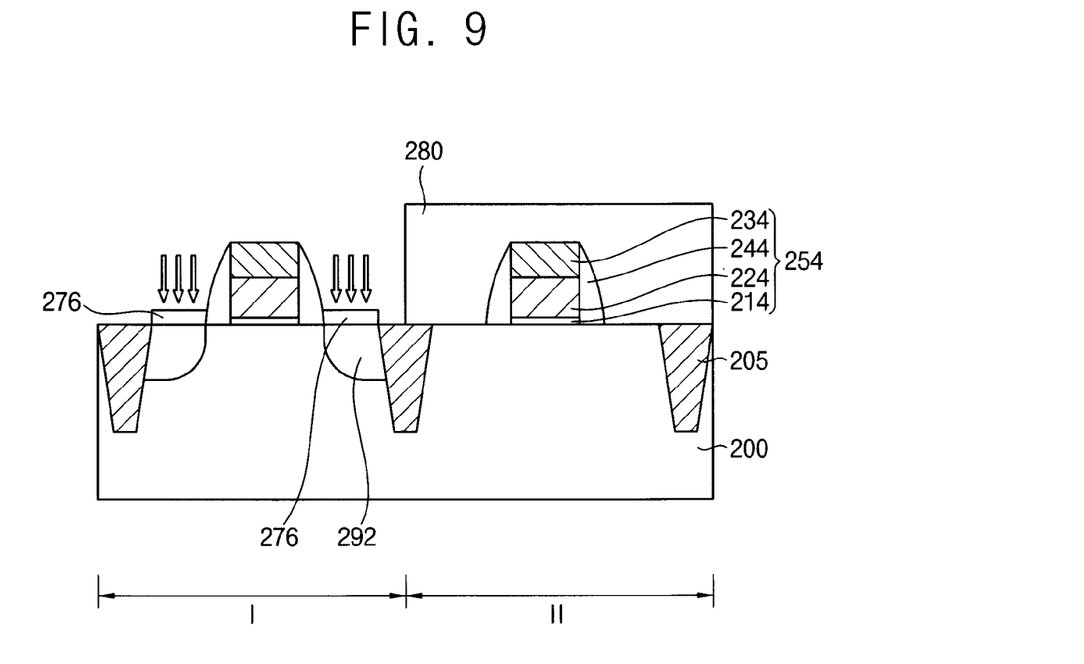

Referring to FIG. 9, a first mask 280 may be formed to cover the second gate structure 254 and the substrate 200 in the second region II. A first implantation process may be performed by implanting first impurities into the first epitaxial layer 272 and a first upper portion of the substrate 200 in the first region I using the first gate structure 252 as an ion implantation mask. Thus, a first impurity region 292 may be formed at the first upper portion of the substrate 200 adjacent to the first gate structure 252, and the first epitaxial layer 272 may be transformed into a first ESD layer 276. According to an exemplary embodiment, the first impurities may include n-type impurities such as phosphorous or arsenic. In an exemplary embodiment, the first impurity region 292 may be formed to have a depth of 100 Å to about 1000 Å, but is not limited thereto.

During the first ion implantation process, carbon ions may be also implanted into the first epitaxial layer 272 and the first upper portion of the substrate 200 adjacent to the first gate structure 252. In an exemplary embodiment, carbon ions may be implanted at a dose of about 5E19 to about 5E21 ions/$cm^3$. The first impurity region 292 and the first ESD layer 276 may include silicon carbide (SiC). The first impurity region 292 may include carbon therein so that a tensile stress may be applied to side portions of a channel region between the first impurity regions 292, thereby enhancing the electron mobility of the channel region.

Alternatively, carbon ions may be implanted before or after the first ion implantation process. According to an exemplary embodiment, an additional heat treatment process may be performed after the first ion implantation process. The first mask 280 may also be removed.

Figure 10:
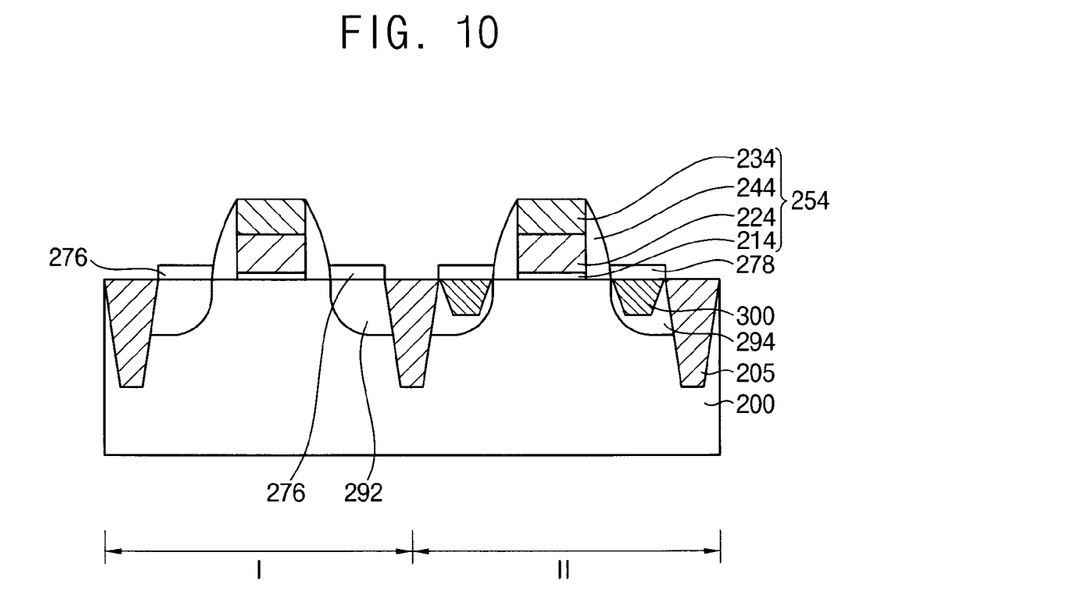

Referring to FIG. 10, a second mask (not shown) may be formed on the substrate 200 in the first region I to cover the first gate structure 252 and the first ESD layer 276. An upper portion of the substrate 200 in the second region II may be etched using the second gate structure 254 as an etching mask to form a trench (not shown). A sidewall of the trench may be formed to have an angle of about 40 degrees to about 90 degrees with respect to an upper face of the substrate 200. Preferably, the sidewall of the trench may be formed to have an angle of about 40 degrees to about 80 degrees with respect to the upper face of the substrate 200. In an exemplary embodiment, the sidewall of the trench may have an angle of about 56 degrees to the upper face of the substrate 200. According to an exemplary embodiment, a plurality of trenches may be formed, and sidewalls of the trench may have various angles relative to the upper face of the substrate 200.

A second SEG process may be performed using dichlorosilane ($SiH_2Cl_2$) gas and germane ($GeH_4$) gas as a source gas to form a silicon-germanium (SiGe) layer 300 including a single crystalline silicon-germanium in the trench. Due to the lattice parameter difference between the SiGe layer 300 and the substrate 200 including silicon, a compressive stress may be applied to the channel region, thereby improving the hole mobility of the channel region.

A third SEG process may be performed using dichlorosilane ($SiH_2Cl_2$) gas as a source gas to form a second epitaxial layer including single crystalline silicon on the SiGe layer 300 and a second top surface of the substrate 200 in the second region II that is not covered by the second gate structure 254.

A second implantation process may be performed by implanting second impurities into the second epitaxial layer and a second upper portion of the substrate 200 in the second region II using the second gate structure 254 as an ion implantation mask. In this case, the second impurities may be implanted into the SiGe layer 300 as well. A second impurity region 294 may be formed at the second upper portion of the substrate 200 in the second region II adjacent to the second gate structure 254, and the second epitaxial layer may be transformed into a second ESD layer 278. In example embodiments, the second impurities may include p-type impurities such as boron or gallium. In an example embodiment, the second impurity region 294 may be formed to have a depth of about 100 Å to about 1000 Å, but is not limited thereto. The second mask may also be removed.

Figure 11:
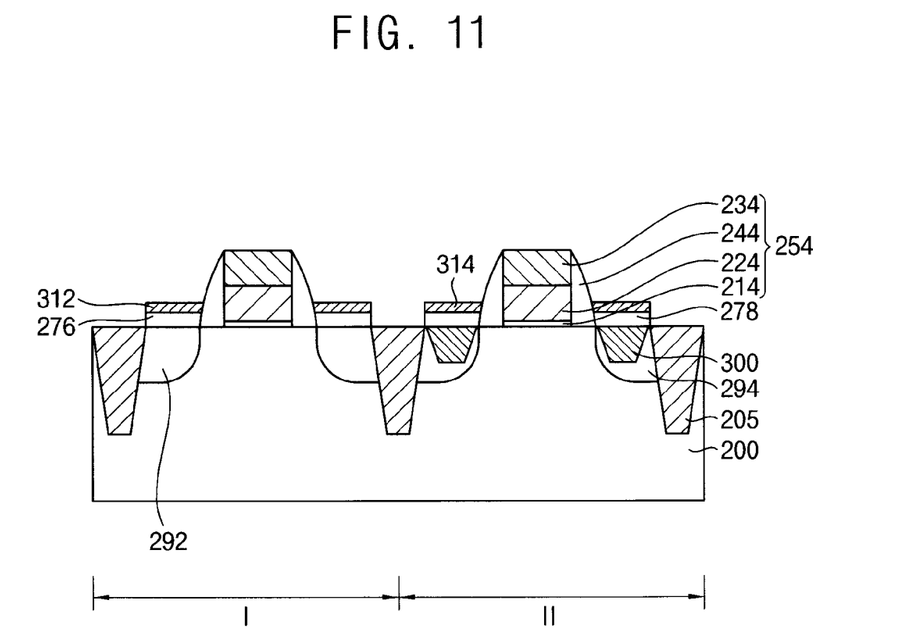

Referring to FIG. 11, a first ohmic layer 312 and a second ohmic layer 314 may be formed on the first and second ESD layers 276 and 278, respectively. According to an exemplary embodiment, a metal layer may be formed on the ESD layers 276 and 278, and a heat treatment process may be performed on the metal layer together with the ESD layers 276 and 278 to form the ohmic layers 312 and 314 including a metal silicide. The metal layer may be formed using titanium, nickel, cobalt or platinum. In an exemplary embodiment, the ohmic layers 312 and 314 may be formed to have a thickness of about 100 Å to about 500 Å, but are not limited thereto.

According to exemplary embodiments, the ESD layer 276 may be formed between the ohmic layer 312 and the first impurity region 292. Thus, carbon and silicon in the first ESD layer 276 may be consumed when the ohmic layer 312 is formed, while the first impurity region 292 may maintain the initial carbon concentration thereof. The tensile stress applied to the channel region may not be reduced, thereby improving electron mobility of the channel region.

Figure 12:
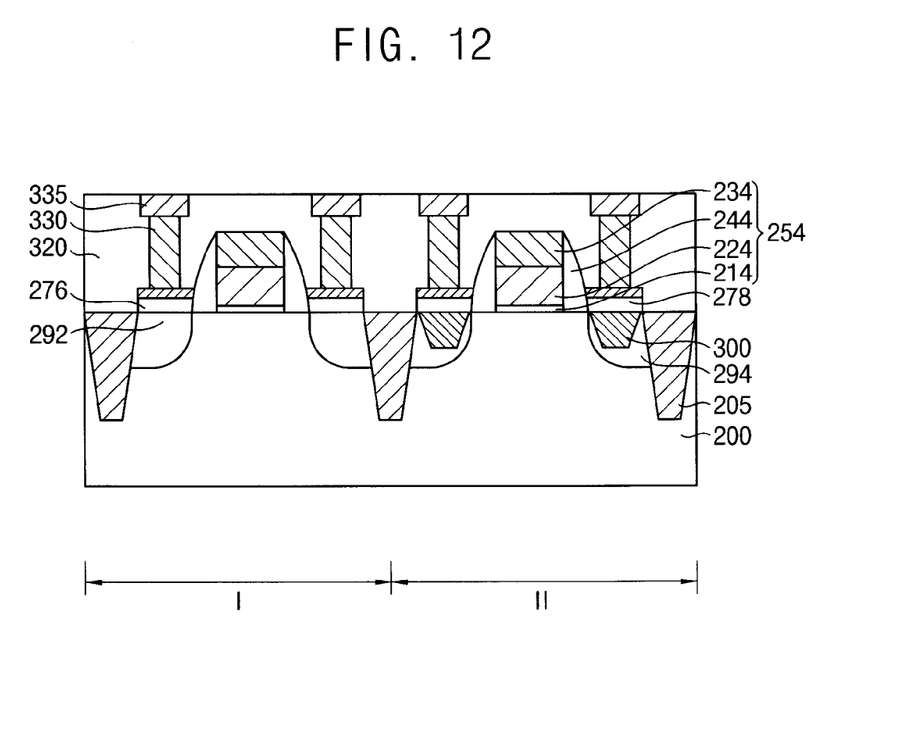

Referring to FIG. 12, a first insulating interlayer 320 may be formed on the substrate 200 to cover the first and second gate structures 252 and 254, the first and second ESD layers 276 and 278 and the first and second ohmic layers 312 and 314. In an exemplary embodiment, the first insulating interlayer 320 may have a thickness of about 6000 Å. First plugs 330 and first wirings 335 may be formed through the first insulating interlayer 320 to be electrically connected to the ohmic layers 312 and 314. In an exemplary embodiment, the first plugs 330 and the first wirings 335 may be formed using a metal such as copper by a damascene process.

Figure 13:
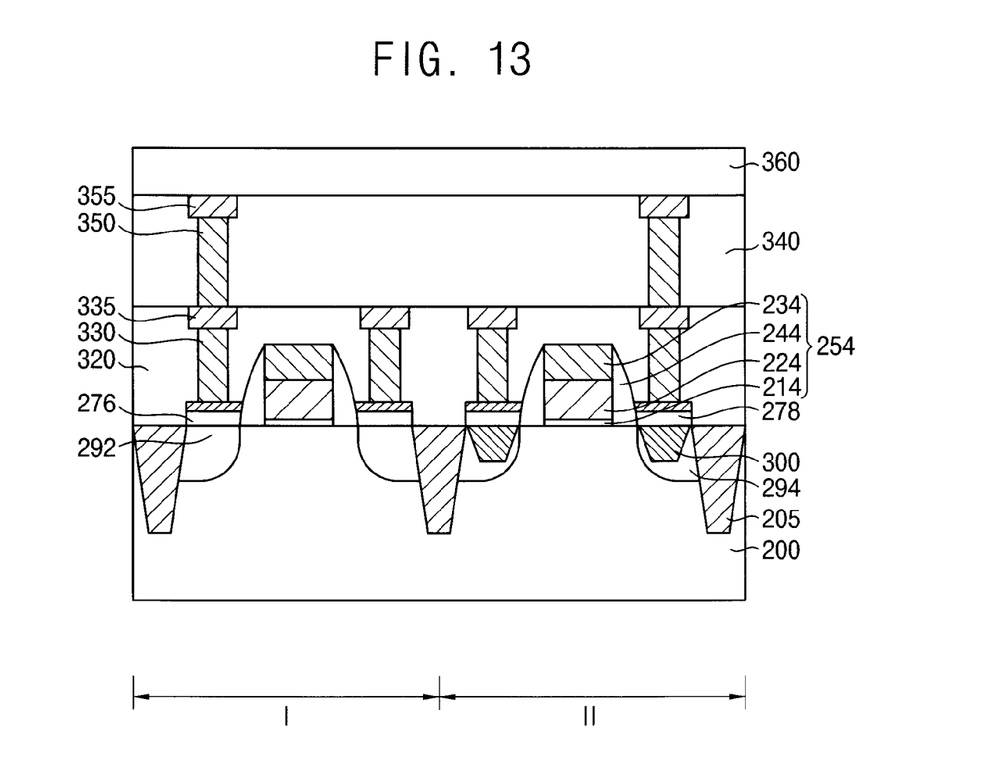

Referring to FIG. 13, a second insulating interlayer 340 may be formed on the first insulating interlayer 340 and the first wirings 335. Second plugs 350 and second wirings 355 may be formed through the second insulating interlayer 340 to be electrically connected to the first wirings 335. In an exemplary embodiment, the second plugs 350 and the second wirings 355 may be formed using a metal such as copper by a damascene process.

A protection layer 360 may be formed on the second insulating interlayer 340 and the second wirings 350 to manufacture the semiconductor device.

According to one or more exemplary embodiments, the semiconductor device may have the first impurity region 292 including carbon in the first region I so that a tensile stress may be applied to the channel region of the NMOS transistor, thereby improving the electron mobility thereof. Also, the semiconductor device may have the SiGe layer 300 in the second region II so that a compressive stress may be applied to the channel region of the PMOS transistor, thereby improving the hole mobility thereof. Thus, the semiconductor device may have high operation current characteristics and improved operation speed.

Figure 14:
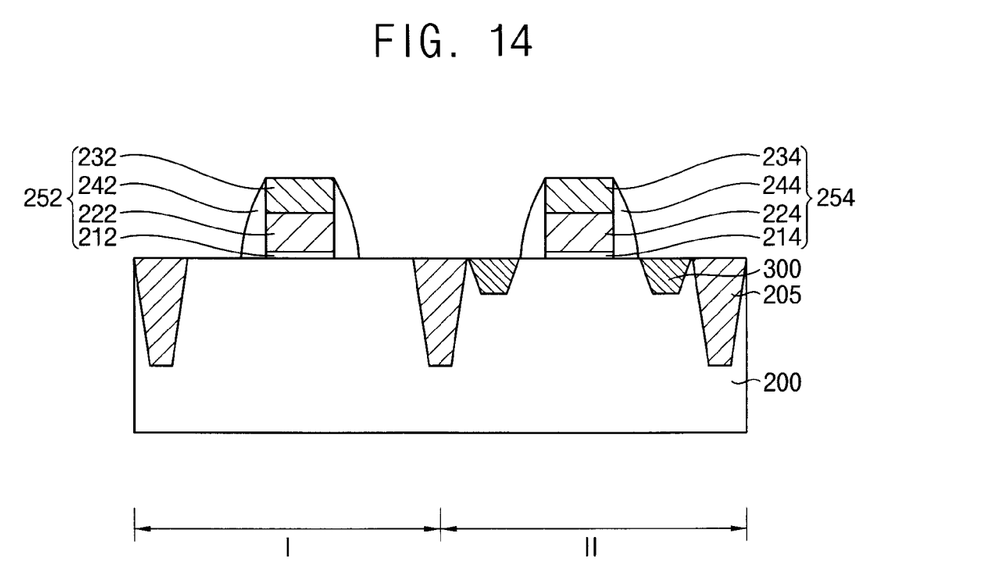
FIGS. 14 to 16 are cross-sectional views illustrating a method of manufacturing a semiconductor device in accordance with an exemplary embodiment.
Figure 15:
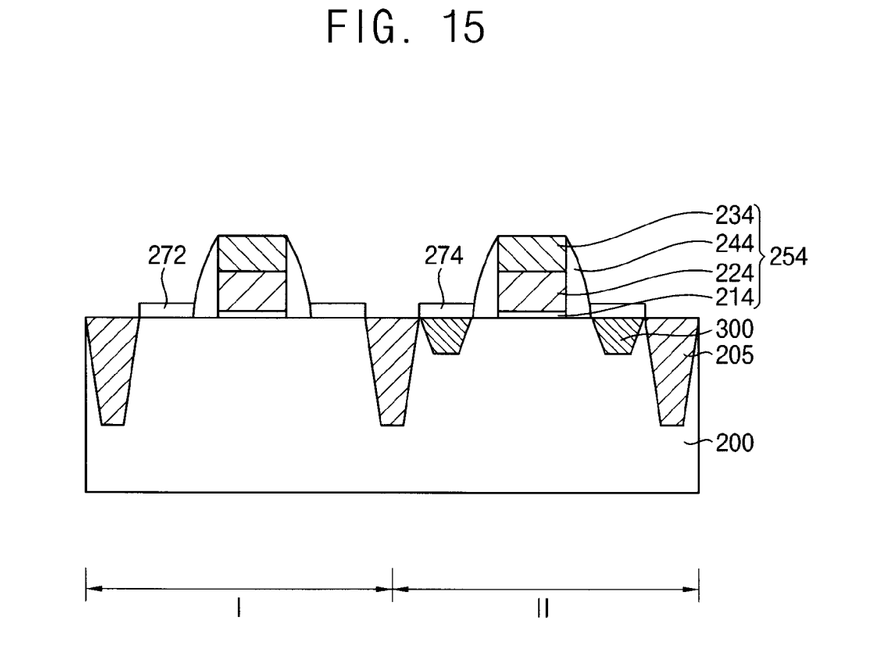
Figure 16:
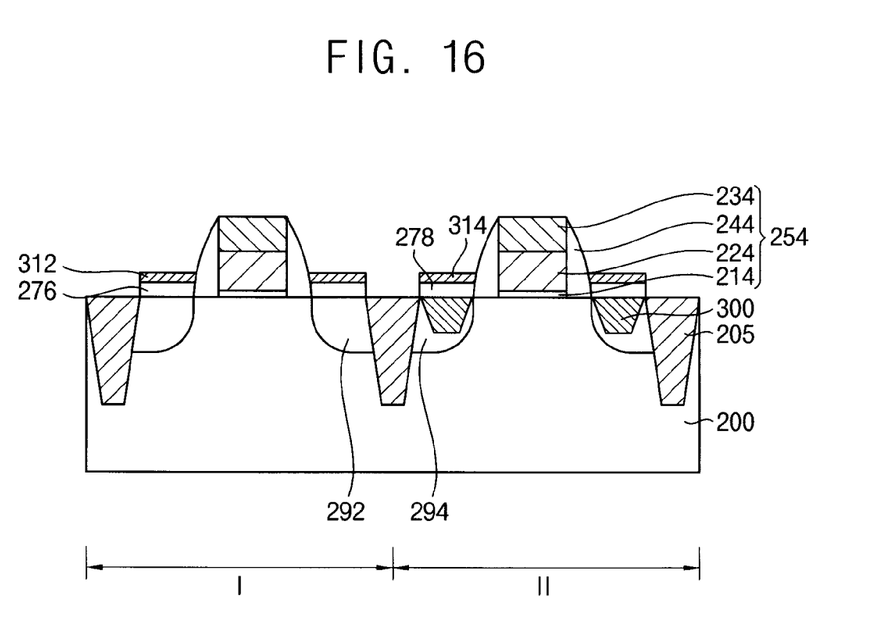

FIGS. 14 to 16 are cross-sectional views illustrating a method of manufacturing a semiconductor device in accordance with an exemplary embodiment. The method may be substantially the same as or similar to that illustrated with reference to FIGS. 5 to 13 except that the order of forming the ESD layers and the impurity region, and forming the SiGe layer is different, and thus detailed explanations thereabout is omitted here.

Referring to FIG. 14, first and second gate structures 252 and 254 may be formed in a first region I and a second region II, respectively, on a substrate 200 including an isolation layer pattern 205 thereon, by performing the processes illustrated with reference to FIGS. 5 and 6.

A SiGe layer 300 may be formed on the substrate 200 in the second region II by performing the processes illustrated with reference to FIG. 10.

Referring to FIG. 15, a first epitaxial layer 272 may be formed on a first top surface of the substrate 200 in the first region I that is not covered by the first gate structure 252, and a second epitaxial layer 274 may be formed on the SiGe layer 300 and a second top surface of the substrate 200 in the second region II that is not covered by the second gate structure 254, by performing the processes illustrated with reference to FIGS. 8 to 10.

Referring to FIG. 16, the processes illustrated with reference to FIG. 11 may be performed. Specifically, first and second ESD layers 276 and 278 may be formed on the substrate 200 in the first and second regions I and II, respectively. A first impurity region 292 and a second impurity region 294 may be formed at first and second upper portions of the substrate 200 in the first and second regions I and II, respectively. First and second ohmic layers 312 and 314 may be formed on the first and second ESD layers 276 and 278, respectively.

The semiconductor device may be manufactured by performing the processes illustrated with reference to FIGS. 12 and 13.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the described aspects of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device, comprising:
    forming a gate structure on a substrate;
    forming an epitaxial layer on a top surface of the substrate adjacent to the gate structure, the epitaxial layer including silicon;
    forming an elevated source/drain (ESD) layer and an impurity region by implanting both of impurities and carbon in the epitaxial layer and an upper portion of the substrate using the gate structure as an ion implantation mask, both of the ESD layer and the impurity region including silicon carbide doped with the impurities; and
    forming a metal silicide layer on the ESD layer.

2. The method of claim 1, wherein forming the epitaxial layer comprises performing a selective epitaxial growth (SEG) process using the top surface of the substrate adjacent to the gate structure as a seed layer.

3. The method of claim 1, wherein the impurities comprise n-type impurities.

4. The method of claim 1, wherein forming the metal silicide layer includes:
    depositing a metal layer on the ESD layer; and
    performing a heat treatment process on the metal layer together with the ESD layer.

5. The method of claim 4, wherein the metal layer comprises at least one of titanium, nickel, cobalt, and platinum.

6. The method of claim 4, wherein during the forming of the metal silicide layer, at least a portion of the carbon implanted in the epitaxial layer is consumed.

7. The method of claim 1, wherein the implanting impurities and carbon forms an impurity region at an upper portion of the substrate.

8. The method of claim 7, wherein the impurity region has a thickness of about 100 Å to about 1000 Å.

9. The method of claim 1, wherein the carbon is implanted at a dose of about 5E19 to about 5E21 ions/cm$^3$.

10. A method of manufacturing a semiconductor device comprising:
    forming first and second gate structures on first and second regions of a substrate, respectively;
    forming a first epitaxial layer on a first top surface of the substrate in the first region adjacent to the first gate structure, the first epitaxial layer including silicon;
    forming a first ESD layer and a first impurity region by implanting both of first impurities and carbon in the first epitaxial layer and a first upper portion of the substrate in the first region using the first gate structure as an ion implantation mask, both of the first ESD layer and the first impurity region including silicon carbide doped with the first impurities;
    forming a silicon-germanium (SiGe) layer on the substrate in the second region adjacent to the second gate structure; and
    forming a first metal silicide layer on the first ESD layer.

11. The method of claim 10, further comprising:
    forming a second epitaxial layer on the SiGe layer and a second top surface of the substrate in the second region adjacent to the second gate structure;
    forming a second ESD layer and a second impurity region by implanting second impurities in the second epitaxial layer and a second upper portion of the substrate in the second region using the second gate structure as an ion implantation mask; and
    forming a second metal silicide layer on the second ESD layer.

12. The method of claim 11, wherein forming the second metal silicide layer is performed simultaneously with forming the first metal silicide layer.

13. The method of claim 11, wherein the first impurities are n-type impurities and the second impurities are p-type impurities.

14. The method of claim 10, wherein forming the SiGe layer includes:
  forming a trench by removing an upper portion of the substrate in the second region adjacent to the second gate structure; and
  forming the SiGe layer by performing an SEG process to fill the trench.

15. The method of claim 10, further comprising forming a wiring that is electrically connected to the first metal silicide layer.

16. The method of claim 1, wherein the impurity region is formed by an ion implantation, by implanting the impurities and the carbon into the upper portion of the substrate disposed underneath the epitaxial layer.

17. A method of manufacturing a semiconductor device, the method comprising:
  forming a gate structure on a substrate;
  forming an elevated source/drain (ESD) layer on a top surface of the substrate adjacent to the gate structure, the ESD layer including silicon;
  forming an impurity region underneath the ESD layer; and
  forming a metal silicide layer on the ESD layer,
  wherein the ESD layer is formed between the impurity region and the metal silicide layer, by implanting both of impurities and carbon in an epitaxial layer disposed on an upper portion of the substrate by using the gate structure as an ion implantation mask, the ESD layer including silicon carbide doped with the impurities, and
  the impurity region underneath the ESD layer is formed by implanting both of the impurities and the carbon in the upper portion of the substrate disposed underneath the epitaxial layer by using the gate structure as the ion implantation mask, the impurity region including silicon carbide doped with the impurities.

18. The method of claim 17, wherein, in forming the ESD layer and in forming the impurity layer underneath the ESD layer, the carbon is implanted at a dose of about 5E19 to about 5E21 ions/cm$^3$, by using the gate structure as the ion implantation mask.

19. The method of claim 18, wherein, in the forming the metal silicide layer, a portion of the carbon in the ESD layer is consumed, while the carbon in the impurity region is substantially maintained at an original carbon concentration.

20. The method of claim 1, wherein the forming the gate structure comprises:
  forming a gate electrode; and
  forming a spacer on sidewalls of the gate electrode,
  wherein the upper portion of the substrate into which the impurities and the carbon are implanted to form the impurity region underneath the ESD is spaced from the gate electrode by a length of the spacer.

* * * * *